United States Patent
Bartley et al.

(10) Patent No.: US 7,477,568 B2
(45) Date of Patent: Jan. 13, 2009

(54) USING COMMON MODE DIFFERENTIAL DATA SIGNALS OF DDR2 SDRAM FOR CONTROL SIGNAL TRANSMISSION

(75) Inventors: Gerald K. Bartley, Rochester, MN (US); Darryl J. Becker, Rochester, MN (US); Paul E. Dahlen, Rochester, MN (US); Philip R. Germann, Oronoco, MN (US); Andrew B. Maki, Rochester, MN (US); Mark O. Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/034,773

(22) Filed: Feb. 21, 2008

(65) Prior Publication Data

US 2008/0151658 A1 Jun. 26, 2008

Related U.S. Application Data

(63) Continuation of application No. 11/383,023, filed on May 12, 2006, now Pat. No. 7,362,651.

(51) Int. Cl.
*G11C 8/00* (2006.01)

(52) U.S. Cl. .................. 365/233; 365/230.02; 365/214
(58) Field of Classification Search ................ 365/233, 365/230.02, 214
See application file for complete search history.

(56) References Cited

U.S. PATENT DOCUMENTS

| | | | |
|---|---|---|---|
| 5,973,991 A * | 10/1999 | Tsuchida et al. | 365/233.1 |
| 7,113,446 B2 * | 9/2006 | Fujisawa | 365/189.15 |
| 7,161,865 B2 | 1/2007 | Fujisawa | |
| 7,259,998 B2 * | 8/2007 | Watanabe | 365/233.16 |
| 7,379,316 B2 * | 5/2008 | Rajan | 365/63 |
| 2005/0117433 A1 | 6/2005 | Fujisawa | |
| 2005/0141333 A1 | 6/2005 | Fujisawa | |
| 2005/0276150 A1 | 12/2005 | Vogt | |
| 2007/0019493 A1 | 1/2007 | Toba et al. | |

\* cited by examiner

*Primary Examiner*—Tuan T. Nguyen
(74) *Attorney, Agent, or Firm*—Cantor Colburn LLP

(57) ABSTRACT

A double-data-rate two synchronous dynamic random access (DDR2) memory circuit includes a low-speed input path and a high-speed input path coupled thereto by an input coupling and forming a common input, the common input coupled to a memory core, the memory core having a common output wherein a high-speed output path and a low-speed output path are coupled together by an output coupling and further coupled to the common output of the memory core.

4 Claims, 3 Drawing Sheets

USING COMMON MODE DIFFERENTIAL DATA SIGNALS OF DDR2 SDRAM FOR CONTROL SIGNAL TRANSMISSION

REFERENCE TO RELATED APPLICATION

This application is filed under 37 CFR §1.53(b) as a continuation application and claims priority under 35 U.S.C. §120 to U.S. patent application Ser. No. 11/383,023, filed May 12, 2006 now U.S. Pat. No. 7,362,651.

BACKGROUND OF THE INVENTION

1. Field of the Invention

This invention relates to design of memory circuits and particularly to an enhancement for DDR2 memory.

2. Description of the Related Art

One advantage of DDR2 memory structures is the ability to use clock speeds that are higher than typically found in DDR SDRAM (double-data-rate synchronous dynamic random access memory).

DDR SDRAM achieves greater bandwidth than ordinary SDR SDRAM (single-data-rate) by transferring data on both the rising and falling edges of the clock signal, and is considered "double pumped." This effectively nearly doubles the transfer rate without increasing the frequency of the front side bus. Thus a 100 MHz DDR system has an effective clock rate of 200 MHz when compared to equivalent SDR SDRAM.

DDR2 is the new generation of DDR technology. The primary benefit is the potential for faster throughput. In addition, the DDR2 improves the power consumption of the DIMM because it works on a lower voltage. DDR operates at a range of 2.5 to 2.8 V, whereas DDR2 only requires 1.8 V. DDR2 consumes less power than DDR and offers a higher range of throughput because it has halved the speed of the memory core (thereby reducing power consumption), but offsetting that by doubling the number of prefetches from the memory core to the I/O buffers (from 2 to 4).

Both DDR and DDR2 are double pumped. That is, data is transferred on both the rising and the falling edges of the clock signal, or at points of 0.0 V and 2.5 V (1.8 V for DDR2 ). This achieves an effective data transfer rate of 200 MHz (and a theoretical bandwidth of 1.6 GB/s) with the same clock frequency when compared with SDR SDRAM operating at 100 MHz. The clock frequency for DDR2 is further boosted by electrical interface improvements, on-die termination, pre-fetch buffers and off-chip drivers. However, latency is greatly increased as a trade-off. The DDR2 pre-fetch buffer is 4 bits wide, whereas the pre-fetch buffer is 2 bits wide for DDR and 8 bits wide for DDR3.

In DDR2, power savings are achieved primarily due to an improved manufacturing process, resulting in a drop in of the operating voltage from 2.5 V for DDR to 1.8 V for DDR2. Further, DDR2 uses a real clock frequency of about half that of SDRAM while maintaining about the same bandwidth. The lower frequency at the memory core means less power consumption and the ability to increase data density (and therefore capacity), and increase speeds as manufacturing technology improves.

For DDR2 memory, improving wiring density and logic density present significant opportunities for performance enhancements. A need exists to increase logic functions while using a minimum circuit area to optimize the operation and use of DDR2 memory.

SUMMARY OF THE INVENTION

The shortcomings of the prior art are overcome and additional advantages are provided through the provision of a double-data-rate two synchronous dynamic random access (DDR2) memory circuit having a low-speed input path and a high-speed input path coupled thereto by an input coupling and forming a common input, the common input coupled to a memory core, the memory core having a common output wherein a high-speed output path and a low-speed output path are coupled together by an output coupling and further coupled to the common output of the memory core.

Also disclosed is a method for obtaining a logical signal from a double-data-rate two synchronous dynamic random access (DDR2 ) memory circuit, the method providing for selecting a DDR2 memory circuit having a low-speed input path and a high-speed input path coupled thereto by an input coupling and forming a common input, the common input coupled to a memory core, the memory core having a common output wherein a high-speed output path and a low-speed output path are coupled together by an output coupling and further coupled to the common output of the memory core; providing a low-speed input signal and a high-speed input signal to the memory circuit; and varying a common-mode voltage for the memory circuit to transmit a logical signal from the memory circuit.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically, a solution has been achieved that provides a method for obtaining a logical signal from a double-data-rate two synchronous dynamic random access (DDR2) memory circuit, the method including selecting a DDR2 memory circuit having a low-speed input path and a high-speed input path coupled thereto by an input coupling and forming a common input, the common input coupled to a memory core, the memory core having a common output wherein a high-speed output path and a low-speed output path are coupled together by an output coupling and further coupled to the common output of the memory core; providing a low-speed input signal and a high-speed input signal to the memory circuit; varying a common-mode voltage for the memory circuit between about 0 volts and about 1.8 volts to transmit a logical signal having a low-speed output signal and a high-speed output signal from the memory circuit; and filtering the low-speed output signal from the high-speed output signal and providing the low-speed output signal to a multiplexer for distributing the logical signal.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

The teachings herein provide for a high-speed differential signaling scheme for double-data-rate two synchronous dynamic random access memory (DDR2 SDRAM, or DDR2). The signaling scheme varies a common-mode voltage, thus causing the common-mode voltage to transmit a logical signal. The operating voltage for the memory circuit disclosed herein ranges from about 0 volts to about 1.8 volts.

In the typical embodiment, slower DDR2 control signals (RAS/CAS etc.) are not structured using separate input paths and output paths (I/O's), but are transmitted via the common-mode of the higher speed differential signals. Using this design, the number of package pins and package/board wiring lanes required to implement DDR2 memory are reduced when compared to prior art designs for DDR2.

The teachings herein provide a high speed differential receiver having a common-mode that can be varied at a desired lower speed without effecting signal integrity of a received high speed signal. As disclosed herein, two input paths (input signals) are ganged together (i.e., coupled). One input path that is coupled provides a high-speed signal (DQS [n]) while another input path that is coupled provides a low-speed signal (WE∥RAS∥CAS). In this design, both the high-speed signal and the low-speed signal are transmitted at the same time via a center node (i.e., common input). The receiver typically uses one of a filter and a tap off the center node of the termination network to determine the low-speed control signal (WE∥RAS∥CAS) from the high-speed data signal DQS[n]. This results in a reduced size for the differential receiver and fewer packaging pins. Exemplary embodiments are provided in FIG. 1 and FIG. 2.

Figure 1:
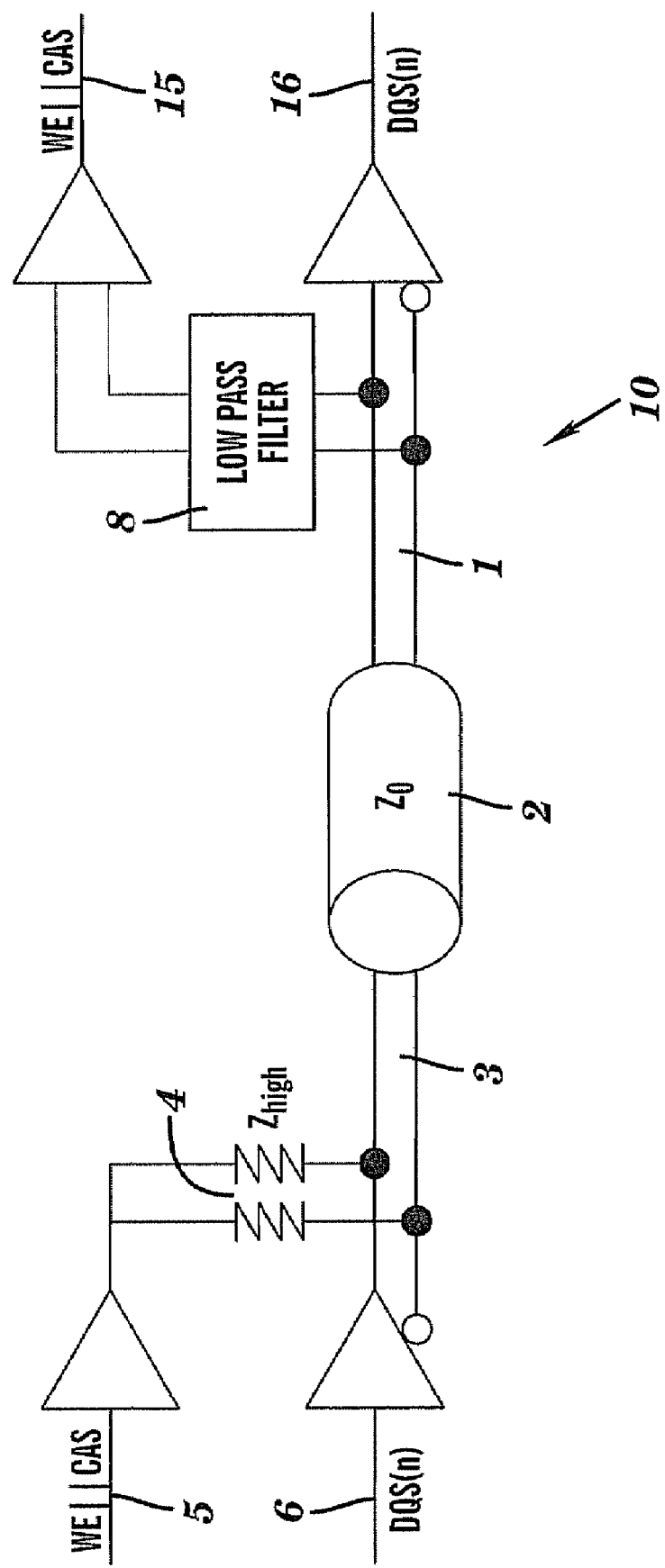
FIG. 1 illustrates one example of a high speed differential receiver having ganged drivers.
Figure 2:
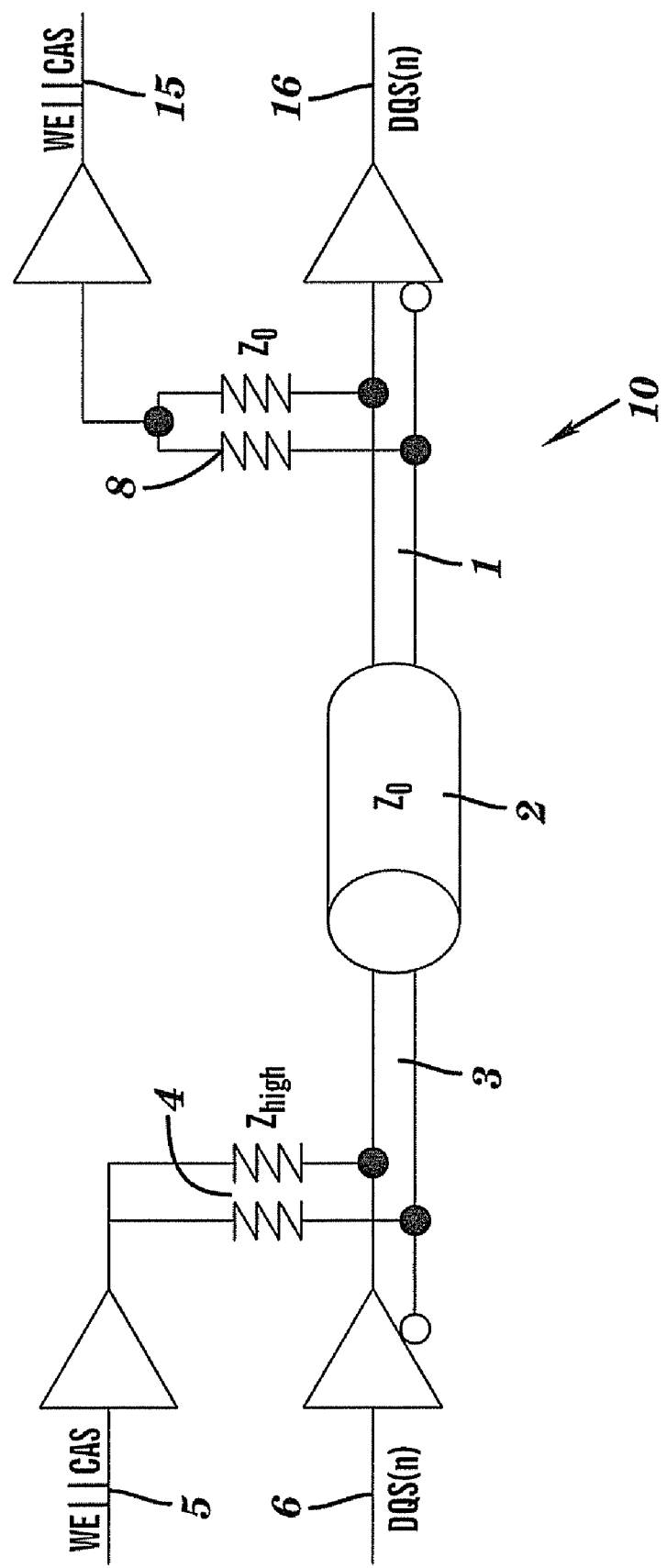
FIG. 2 illustrates another example of the high speed differential receiver having ganged drivers.

Referring to FIG. 1 and FIG. 2, a tuned high-speed differential receiver 10 includes a low-speed input signal 5 that is coupled to an high-speed input signal 6 via an input coupling 4. The input coupling 4 forms a common input 3 (the center node) for access to a memory core 2. Emerging from the memory core 2 is a common output 1. The common output 1 provides signals from the memory core 2 for a low-speed output signal 15 and a high-speed output signal 16. The low-speed output signal 15 is coupled to high-speed output signal 16 via an output coupling 8.

In FIG. 1, the output coupling 8 includes a low pass filter to provide discrimination for the low-speed output signal 15. In FIG. 2, the output coupling 8 includes a tap being a resistive coupling. It should be noted that the use of the low-pass filter and the resistive coupling are illustrative, non-limiting and merely exemplary components for the coupling of the high-speed output signal 16 to the low-speed output signal 15.

Figure 3:
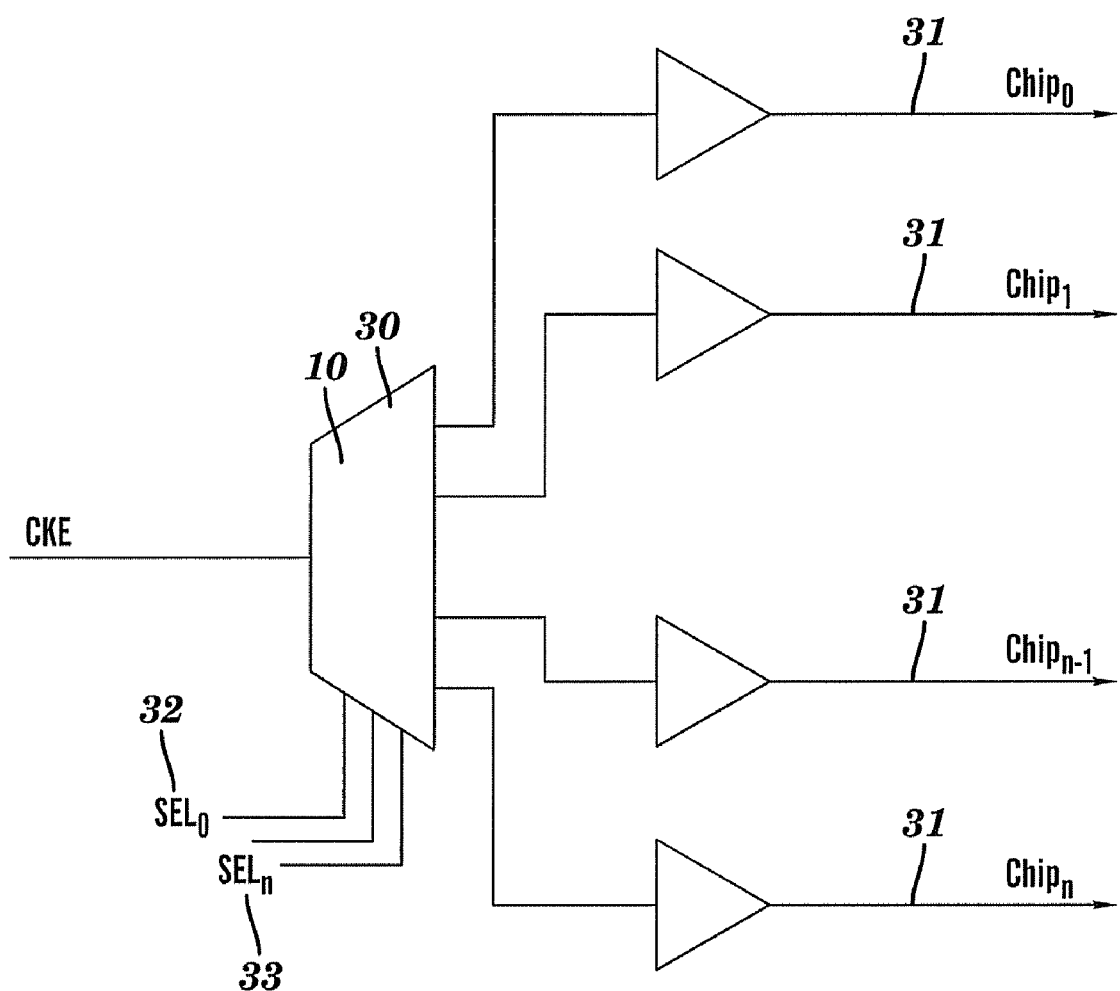
FIG. 3 illustrates an example of an embodiment where a slow-speed multi-drop signal is sent in a common mode of a high speed point-to-point signal.

Referring now to FIG. 3, an embodiment is depicted for implementing the tuned high-speed differential receiver 10 in an existing DDR2 environment. The design presented in FIG. 3 provides functionality for avoiding problems that might arise as the control signals are multi-drop and the differential data is point-to-point. In this example, a slow-speed multi-drop signal 32 is sent in the common-mode of a high-speed point-to-point signal 33. In this embodiment, a multiplexer 30 is called for to properly redistribute the slow signal to the appropriate destinations 31. Note that in this depiction, "CKE" represents a clock enable signal.

It should also be noted that as used herein, the terminology regarding signals, wires, pathways and communication paths are generally very similar, and may in some instances be synonymous. Accordingly, this disclosure and the teachings herein are not to be limited by any conventional or otherwise inconsistent interpretations.

Advantages of the teachings herein include transmission of data, address information and control information with fewer wires (i.e., communication pathways). Greater transmission of data, address information and control information is achievable using architectures of the prior art. Further, adding functions such as RAS, Jtag, error reporting and others can be achieved without the addition of more wires. Additional features could include, without limitation: tuning of elastic interface settings, deskew, and others; report status back from DRAMs; and use of the tuned high-speed differential receiver 10 as a counter (in DMA like functions); as well as CRC and ECC event reporting.

Although the teachings herein provide for implementation of the tuned high-speed differential receiver 10 as a memory unit in DDR2 architecture, the teachings herein are merely exemplary of techniques for signal processing and not necessarily limited by the recited architecture. Accordingly, it should be recognized that certain annotations (e.g., WE∥RAS∥CAS, DQS) herein may correlate to DDR2 specifications and are drawn therefrom, but that these annotations are merely illustrative and are not limiting.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A double-data-rate two synchronous dynamic random access (DDR2) memory circuit comprising:
    a low-speed input path and a high-speed input path coupled thereto by an input coupling and forming a common input, the common input coupled to a memory core, the memory core having a common output wherein a high-speed output path and a low-speed output path are coupled together by an output coupling and further coupled to the common output of the memory core.

2. The DDR2 memory circuit of claim 1, wherein the output coupling comprises one of a filter and a tap.

3. The DDR2 memory circuit of claim 2, wherein the filter comprises a low-pass filter.

4. The DDR2 memory circuit of claim 1, wherein an operating voltage for the memory circuit is within a range of about 0 volts to about 1.8 volts.

* * * * *